United States Patent [19]

Okamoto

[11] 3,860,423

[45] Jan. 14, 1975

[54] ETCHING SOLUTION FOR SILVER

[75] Inventor: Fumio Okamoto, Kamakura, Japan

[73] Assignee: RCA Corporation, New York, N.Y.

[22] Filed: Aug. 24, 1973

[21] Appl. No.: 391,358

[52] U.S. Cl. .......................... 96/36.2, 156/8, 156/18, 252/79.5

[51] Int. Cl. .......................... C23f 1/02

[58] Field of Search .......................... 156/3, 8, 17, 18; 252/79.1, 79.4, 79.5; 96/36.2

[56] References Cited

UNITED STATES PATENTS 3,158,517 11/1964 Schwarzenberger .......................... 156/17

3,615,470 10/1971 Singletary .......................... 96/36.2 X

*Primary Examiner*—William A. Powell
*Attorney, Agent, or Firm*—Glenn H. Bruestle; Birgit Morris

[57] ABSTRACT

An etching solution useful for removing silver from the surface of acid and base-sensitive metal oxides contains a mixture of ammonia and hydrogen peroxide diluted with methanol.

4 Claims, 1 Drawing Figure

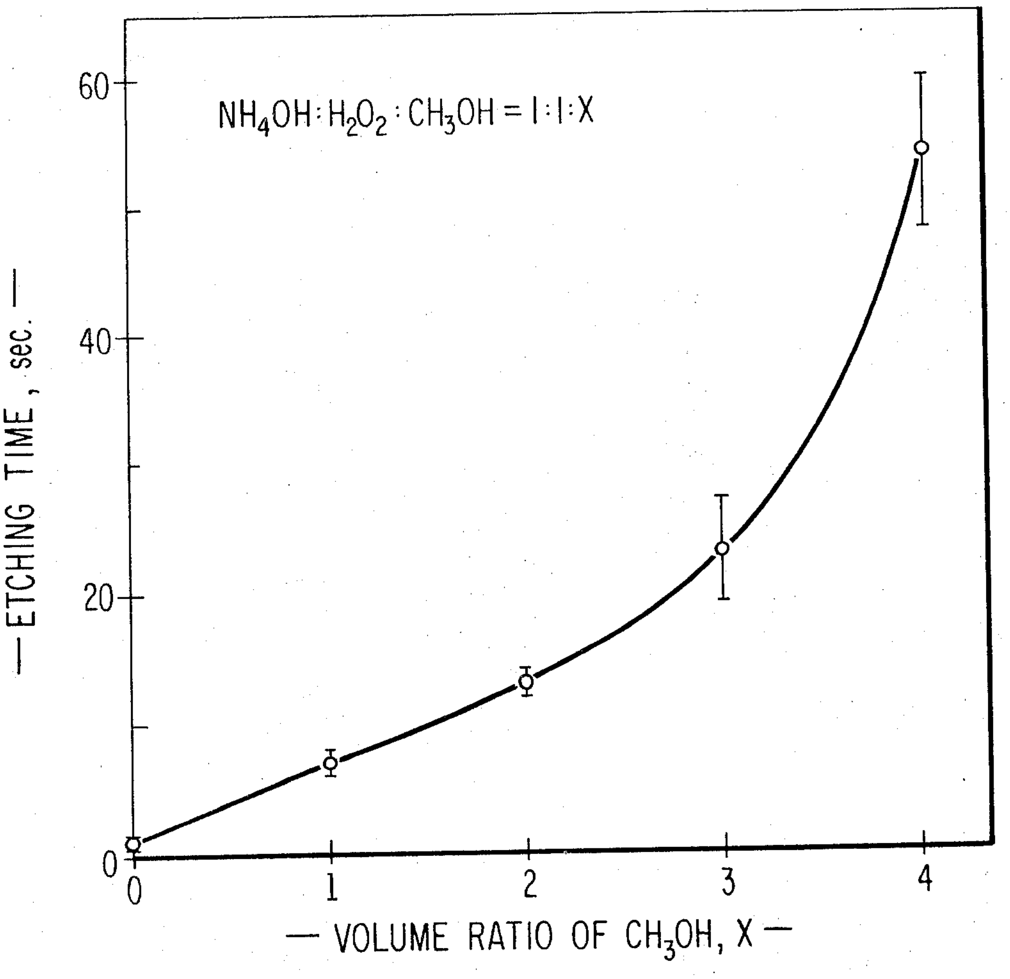
60
40
20
0
0
1
2
3
4
$NH_4OH:H_2O_2:CH_3OH = 1:1:X$
— ETCHING TIME, sec. —
— VOLUME RATIO OF $CH_3OH$, X —

ETCHING SOLUTION FOR SILVER

This invention relates to an improved etching solution for removing silver from acid and base-sensitive metal oxides. More particularly, this invention relates to an improved etching solution for the fabrication of silver patterns on ferroelastic and ferroelectric metal oxides using photoresist techniques.

BACKGROUND OF THE INVENTION

A great deal of interest has been generated recently in fabricating devices from ferroelastic and ferroelectric crystals. Such devices utilize applied electric fields to switch polarization direction, for example. Such electric fields may be applied to the crystals by depositing a conducting metal, such as silver, on the surface of the crystal, in the form of a predetermined pattern, using photoresist techniques. According to typical techniques, a thin film of the conductive metal is deposited on one surface of the crystal, as by painting, vacuum deposition, plating and the like, and a thin film of a photoresist is applied over the metal film. The photoresist is then exposed to light such as through a photomask which defines the pattern. The photoresist is then developed so that certain portions of the resist are dissolved away, thereby exposing the metal layer beneath. The composite oxide-metal layer-photoresist layer is then contacted with an etching solution to dissolve away the exposed metal and finally the remaining photoresist is removed, leaving the remaining metal in the form of the desired pattern on the surface of the crystal.

Certain ferroelectric and ferroelastic crystals, particularly bismuth germanium oxide ($Bi_{12}GeO_{20}$), gadolinium molybdate [$Gd_2(MoO_4)_3$] and lead germanium oxide ($5PbO.3GeO_2$) are highly sensitive to the strong acids and bases present in common etching solutions, or formed during the etching step. Gadolinium molybdate deteriorates rapidly even in water. Thus, during the etching step, the surface of crystals of such materials are damaged or roughened. This surface deterioration interferes with proper operation of devices made from these crystals, particularly surface wave devices for example.

Certain known etching solutions for silver do not contain strong acids and bases, such as ferric nitrate or potassium iodide-iodine. Thus these etching solutions would be candidates for removing silver from acid and base-sensitive metal oxide crystals. However, they have not been found to be satisfactory. These solutions are dark in color and potassium iodine-iodine is not transparent, which makes recognition of the end point - removal of the silver layer difficult. An effective etching solution for these metal oxide crystals should be light in color and transparent, should act rapidly against silver, but should have no effect on the surface of the crystals nor on the photoresist employed.

SUMMARY OF THE INVENTION

An etching solution has been discovered that is compatible with conventional photoresist technology, that acts rapidly against silver and that will not adversely affect the surfaces of ferroelectric and ferroelastic metal oxides. This etching solution is transparent and inexpensive and can be prepared readily from commonly available materials.

BRIEF DESCRIPTION OF THE DRAWINGS

The FIGURE shows the etch rate of an etching solution of the invention as a function of diluent, for a silver film.

DETAILED DESCRIPTION OF THE INVENTION

The etching solution useful herein comprises a mixture of ammonia and hydrogen peroxide diluted with methanol. This etching solution dissolves silver in accordance with the overall equation.

$$2Ag + 4NH_3 + H_2O_2 \rightarrow 2Ag(NH_3)_2^+ + 2OH^-.$$

Although a minimum of one mol of hydrogen peroxide for four mols of ammonia are required in accordance with the above equation, an excess of hydrogen peroxide is preferred and generally from about 1.2 – 4 mols of hydrogen peroxide to 4 mols of ammonia are employed. Two to three mols of hydrogen peroxide per four mols of ammonia are particularly preferred. Both the ammonia and hydrogen peroxide can be admixed with a diluent, such as water. These reagents are commonly available as concentrated ammonia solution and 30 percent hydrogen peroxide solution.

The amount of methanol to be added will vary with the thickness of the silver layer to be removed and the etching rate desired. A slower etch rate is desirable for very thin silver films. As the amount of methanol added is increased, the etching rate is decreased. While the function of the methanol is not clear, it aids in dissipating gaseous by-products of the reaction in addition to reducing the etching rate. The presence of these gas bubbles on the surface of the silver film interferes with the dissolution of the metal and prevents good resolution of very fine patterns. When no diluent is present, or other diluents are substituted for methanol, these gas bubbles are not dissipated, or at least not to the same extent, and very fine patterns cannot be formed. In general, the etching solution should contain from about 50 to about 80 mol percent of methanol, preferably from about 75 to 80 mol percent.

When etching is complete, as noted by the dissolution of the exposed silver layer, the surface is rinsed with an inert solvent, such as methanol, to remove the etching solution and prevent undercutting of the photoresist layer.

The invention will be further illustrated by the following examples but it is to be understood that the invention is not meant to be limited to the details described therein.

EXAMPLE 1

A film of silver 3,000 Angstroms (hereinafter A) thick was deposited onto crystals of bismuth germanium oxide, gadolinium molybdate and lead germanium oxide. An equivolume mixture of concentrated ammonia (about 15 mols/liter of $NH_3$) and 30 percent hydrogen peroxide (about 10 mols/liter of $H_2O_2$) was diluted with varying amounts of methanol (about 25 mols/liter). Etching rate was measured as the time in seconds required to remove all of the silver. The results are shown in the table below:

| Vol. Ratio of $NH_3$, $H_2O_2$ & MeOH | Etching Rate, secs. |
|---|---|
| 1 : 1 : 1 | 7 |
| 1 : 1 : 2 | 12 |
| 1 : 1 : 3 | 22 |
| 1 : 1 : 4 | 53 |

The FIGURE is a graph showing the above etching rates as a function of the volume ratio of methanol to a 1:1 by volume mixture of ammonia and hydrogen peroxide.

EXAMPLE 2

Interdigital transducers of silver on bismuth germanium oxide, gadolinium molybdate and lead germanium oxide are fabricated by depositing a film of silver 3,000A thick on one surface, applying a coating of Waycoat IC Photoresist, available commercially from Philip Hunt Chemical Corporation, and exposing the resultant article to UV light from a high pressure mercury vapor lamp through a photomask (the photoresist has a spectral sensitivity maximum at 3,600A). The photoresist was developed according to the manufacturer's recommendations and the crystals were then immersed in an etching solution made from concentrated ammonia, 30 percent hydrogen peroxide and methanol in a ratio by volume of 1:1:4 for about 50 seconds. The crystals were then rinsed with methanol and the remaining photoresist removed, leaving a silver pattern on the surface of the oxides.

The exposed surfaces of the oxides were completely smooth and unaffected by the above processing.

EXAMPLE 3

As a comparison, the effect of varying the diluent for an equivolume mixture of ammonia and hydrogen peroxide on etching rate of 3,000A thick silver films and on gas bubble dissipation was determined. Results are tabulated below where the control contained no diluent.

| Diluent | Vol.Ratio $NH_3$,$H_2O_2$ & Diluent | Etching Rate, Secs. | Bubble Dissipation |
|---|---|---|---|
| Control | 1:1:0 | 0.8 | Large bubbles cling to surface |
| Water | 1:1:4 | 8 | do. |
| Methanol | 1:1:4 | 50 | Small bubbles dissipate rapidly |
| Ethanol | 1:1:4 | 150 | Small bubbles dissipate slowly |

I claim:

1. In a process for selectively etching thin silver films on a metal oxide substrate to form a pattern which comprises applying a photoresist layer over the silver film, exposing the photoresist to light through a photomask, developing the photoresist to expose a portion of the silver film and etching the exposed film away, the improvement which comprises employing as the etchant a mixture of from about 1.2 to about 4 mols of hydrogen peroxide and 4 mols of ammonia diluted with methanol so that the solution contains from about 50 to about 80 mol percent of methanol.

2. A process according to claim 1 wherein the metal oxide substrates are selected from the group consisting of bismuth germanium oxide, gadolinium molybdate and lead germanium oxide.

3. A process according to claim 1 wherein the mixture contains from about 3 to about 4 mols of hydrogen peroxide to 4 mols of ammonia.

4. The process according to claim 3 wherein the solution contains from about 75 to about 80 mol percent of methanol.

* * * * *